United States Patent
Zhang et al.

(10) Patent No.: US 9,929,123 B2
(45) Date of Patent: Mar. 27, 2018

(54) RESONANT CIRCUIT INCLUDING BUMP PADS

(71) Applicant: Analog Devices, Inc., Norwood, MA (US)

(72) Inventors: Cemin Zhang, Nashua, NH (US); John A. Chiesa, Pelham, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/733,175

(22) Filed: Jun. 8, 2015

(65) Prior Publication Data

US 2016/0359456 A1  Dec. 8, 2016

(51) Int. Cl.
*H03B 5/08* (2006.01)
*H03B 5/18* (2006.01)
(Continued)

(52) U.S. Cl.
CPC .............. *H01L 24/81* (2013.01); *H01L 23/66* (2013.01); *H01L 24/06* (2013.01); *H01L 24/15* (2013.01);
(Continued)

(58) Field of Classification Search
CPC .... H03B 5/124; H03B 5/1206; H03B 5/1243; H03B 2200/0008; H03B 2200/0076; H03B 5/1225; H01L 21/56; H01L 24/81; H01L 25/0657; H01L 23/66; H01L 24/06; H01L 25/50; H01L 24/15; H01L 23/3107; H01L 2223/6627; H01L 2224/0401; H01L 2924/12034; H01L 2924/1206; H01L 2225/06513; H01L 2224/81801;
(Continued)

(56) References Cited

U.S. PATENT DOCUMENTS 4,783,638 A * 11/1988 Mamodaly ........... H03B 5/1876
    331/117 D
5,087,896 A   2/1992 Wen et al.
(Continued)

FOREIGN PATENT DOCUMENTS

CN     104218279 A   12/2014
GB      2476692 A    7/2011

OTHER PUBLICATIONS

Author: Herbert Zirath et al. Title: MMIC-Oscillator designs for ultra low phase noise Date: Jan. 30, 2006; Publisher: IEEE; Pertinent pp. 204-207.*

(Continued)

*Primary Examiner* — Richard Tan
(74) *Attorney, Agent, or Firm* — Knobbe, Martens, Olson & Bear, LLP

(57) ABSTRACT

Aspects of this disclosure relate to a first die includes an LC resonant circuit including a first capacitive element, such as a capacitor or a varactor, and an inductive element. The LC resonant circuit is configured to generate a signal having a frequency of oscillation. The first die includes bump pads electrically coupled to both ends of the first capacitive element. A second die can be flip chip mounted on the first die. Bumps can electrically connect a second capacitive element of the second die in parallel with the first capacitive element of the first die. This can increase the Q factor of the LC resonant circuit.

21 Claims, 7 Drawing Sheets

(51) Int. Cl.
*H01L 23/00* (2006.01)
*H01L 23/66* (2006.01)
*H03B 5/12* (2006.01)

(52) U.S. Cl.
CPC ......... *H03B 5/1225* (2013.01); *H03B 5/1243* (2013.01); *H01L 24/05* (2013.01); *H01L 24/13* (2013.01); *H01L 24/16* (2013.01); *H01L 24/29* (2013.01); *H01L 24/32* (2013.01); *H01L 24/48* (2013.01); *H01L 24/73* (2013.01); *H01L 24/92* (2013.01); *H01L 2223/6627* (2013.01); *H01L 2223/6661* (2013.01); *H01L 2223/6683* (2013.01); *H01L 2224/0401* (2013.01); *H01L 2224/04042* (2013.01); *H01L 2224/05554* (2013.01); *H01L 2224/05555* (2013.01); *H01L 2224/06051* (2013.01); *H01L 2224/06135* (2013.01); *H01L 2224/131* (2013.01); *H01L 2224/13025* (2013.01); *H01L 2224/13147* (2013.01); *H01L 2224/16145* (2013.01); *H01L 2224/17181* (2013.01); *H01L 2224/2919* (2013.01); *H01L 2224/32145* (2013.01); *H01L 2224/32245* (2013.01); *H01L 2224/48091* (2013.01); *H01L 2224/48247* (2013.01); *H01L 2224/73204* (2013.01); *H01L 2224/73207* (2013.01); *H01L 2224/73265* (2013.01); *H01L 2224/81191* (2013.01); *H01L 2224/81192* (2013.01); *H01L 2224/81815* (2013.01); *H01L 2224/92125* (2013.01); *H01L 2224/92163* (2013.01); *H01L 2224/92247* (2013.01); *H01L 2924/00014* (2013.01); *H01L 2924/1423* (2013.01); *H03B 2200/0008* (2013.01); *H03B 2200/0076* (2013.01)

(58) Field of Classification Search
CPC ... H01L 2924/1205; H01L 2224/13014; H01L 2224/81191; H01L 2224/13147; H01L 2224/16145; H01L 2224/92163; H01L 24/05; H01L 24/13; H01L 24/16; H01L 24/29; H01L 24/32; H01L 24/48; H01L 24/73; H01L 24/92; H01L 2223/6683; H01L 2224/04042; H01L 2224/05554; H01L 2224/05555; H01L 2224/06051; H01L 2224/13025; H01L 2224/131; H01L 2224/17181; H01L 2224/2919; H01L 2224/32145; H01L 2224/48091; H01L 2224/48247; H01L 2224/73207; H01L 2224/73265; H01L 2224/81192; H01L 2224/81815; H01L 2224/92125; H01L 2224/92247; H01L 2924/1423; H01L 2223/6661; H01L 2924/00014

USPC .................. 331/107 SL, 117 R, 117 FE, 167
See application file for complete search history.

(56) References Cited

U.S. PATENT DOCUMENTS

| | | | |
|---|---|---|---|
| 5,153,600 A | 10/1992 | Metzler et al. | |
| 5,291,061 A | 3/1994 | Ball | |
| 5,942,950 A | 8/1999 | Merenda | |
| 6,100,953 A | 8/2000 | Kim et al. | |
| 6,310,759 B2* | 10/2001 | Ishigaki | 361/309 |
| 6,466,099 B2 | 10/2002 | Festag | |
| 6,472,747 B2 | 10/2002 | Bazarjani et al. | |
| 6,550,664 B2 | 4/2003 | Bradley et al. | |
| 6,778,041 B2 | 8/2004 | Takahashi et al. | |
| 7,209,017 B2* | 4/2007 | Sze | H03C 3/0958 331/117 R |
| 7,463,107 B2* | 12/2008 | Pittorino | H03B 5/1228 331/117 FE |
| 7,671,806 B2 | 3/2010 | Voigtlaender | |
| 7,821,357 B2 | 10/2010 | Heinze et al. | |
| 8,810,322 B2* | 8/2014 | Rangarajan | H01L 23/645 331/108 D |
| 8,866,291 B2 | 10/2014 | Alm | |
| 8,941,247 B1* | 1/2015 | Gupta | B81C 1/00301 257/686 |
| 8,957,738 B1* | 2/2015 | Koechlin | H03B 5/1293 331/117 R |
| 9,337,138 B1* | 5/2016 | Abugharbieh | H01L 23/5385 |
| 2004/0056725 A1* | 3/2004 | Kitamura | H03L 5/00 331/36 C |
| 2007/0132520 A1* | 6/2007 | Bellaouar | H03J 3/20 331/167 |
| 2007/0182502 A1* | 8/2007 | Shin | H03B 5/1228 331/167 |
| 2011/0279186 A1* | 11/2011 | Hirota | H03B 5/1228 331/117 FE |
| 2012/0049334 A1* | 3/2012 | Pagaila | H01L 21/568 257/666 |
| 2013/0157594 A1* | 6/2013 | Taskov | H03B 5/1215 455/84 |
| 2014/0184346 A1* | 7/2014 | Li | H03B 5/1243 331/115 |
| 2014/0211441 A1 | 7/2014 | Tsukizawa | |
| 2014/0285299 A1* | 9/2014 | Bojer | H01F 21/02 336/105 |

OTHER PUBLICATIONS

Shen, Tze-Min, et al. "Design of Vertically Stacked Waveguide Filters in LTCC," IEEE Transactions on Microwave Theory and Techniques, vol. 55, No. 8, Aug. 2007, pp. 1771-1779.

Jantunen, et al., Design Aspects of Microwave Components with LTCC technique; Journal of the European Ceramic Society 23, 2003; pp. 2541-2548.

* cited by examiner

RESONANT CIRCUIT INCLUDING BUMP PADS

BACKGROUND

Technical Field

Embodiments of the disclosure relate to electronic systems and, more particularly, to resonator circuits.

Description of the Related Technology

Electronic devices can be fabricated on a die. Some electronic devices can include resonators. Resonators can be used in a variety of applications, including oscillators. Example oscillators include Colpitts voltage-controlled oscillators (VCOs), push-push versions of a Colpitts VCO, and Clapp VCOs. A resonator can be characterized by a quality factor ("Q factor"). Losses in the resonator can impact the Q factor. The losses can be reduced and the Q factor can be increased by increasing the size of certain components on the die, such as capacitors. However, increasing the size of components may not be desirable.

SUMMARY OF CERTAIN INVENTIVE ASPECTS

One aspect of this disclosure is a system that includes a first die and a second die. The first die includes an LC resonant circuit comprising a first capacitive element and an inductive element, the first capacitive element having a first end and a second end. The first die also includes a first bump pad electrically coupled to the first end of the first capacitive element and a second bump pad electrically coupled to the second end of the first capacitive element. The second die is stacked on the first die, and the second die includes a second capacitive element having a first end and a second end, a third bump pad electrically coupled to the first end of the second capacitive element, and a fourth bump pad electrically coupled to the second end of the second capacitive element. A first bump electrically couples the first bump pad and the third bump pad, and a second bump electrically couples the third bump pad and the fourth bump pad, such that the first bump and the second bump electrically connect the first capacitive element in parallel with the second capacitive element.

The capacitive element can include a first varactor diode or a first capacitor. The bumps can include a copper pillar, a solder ball, or a solder joint. The inductor can be a choke inductor, and the inductor can be coupled to the first capacitive element by way of a microstrip line. The first die can include a voltage controlled oscillator (VCO) that includes the LC resonant circuit. The VCO can have a resonant frequency that is based on a tuning voltage received by the VCO. The first die can include a plurality of active circuits.

In the system, a second circuit on the second die can be a flipped, mirror image of a first circuit on the first die, and the first circuit can include the first capacitive element. The second circuit can include a microstrip line and bump pads. The first circuit can include at least one capacitor and at least one varactor.

The system can include a package encapsulating the first die and the second die, an insulator disposed between the first die and the second die, and a wire bond coupling the first die to a pin of the package.

Another aspect of the disclosure is a die that includes an LC resonant circuit configured to generate a signal that oscillates at a resonant frequency. The LC resonant circuit includes a capacitive element having a first end and a second end and an inductive element electrically coupled to the capacitive element. The die also includes a first bump pad electrically coupled to the first end of the capacitive element and a second bump pad electrically coupled to the second end of the capacitive element.

The capacitive element can include at least one of a varactor diode or a capacitor. The inductor can be configured as a choke inductor, and the inductor can be coupled to the capacitive element by way of a microstrip line.

The LC resonant circuit can include a second capacitive element, and the die can include a third bump pad connected to the second capacitive element. The die can include a voltage controlled oscillator, and the VCO can include the LC resonant circuit. The first bump pad can be disposed on a first microstrip and the second bump pad can be disposed on a second microstrip.

Another aspect of this disclosure is directed to a method of manufacturing an electronic device. The method includes electrically coupling a first bump from a first end of a first capacitive element on the first die to a first end of a second capacitive element on the second die. The first capacitive element is included in an LC resonant circuit of the first die. The method also includes electrically coupling a second bump from a second end of the first capacitive element on the first die to a second end of the second capacitive element on the second die such that the second capacitive element is electrically connected in parallel with the first capacitive element.

The first bump can be at least one of a copper pillar, a solder ball, or a solder joint.

The method can also include mounting the second die on the first die such that bump pads of the first die are aligned with corresponding bump pads of the second die. The method can also include filling a space between the first die and the second die with an insulating material and encasing the first die and the second die in a packaging material.

For purposes of summarizing the disclosure, certain aspects, advantages, and novel features of the inventions have been described herein. It is to be understood that not necessarily all such advantages can be achieved in accordance with any particular embodiment of the invention. Thus, the invention can be embodied or carried out in a manner that achieves or optimizes one advantage or group of advantages as taught herein without necessarily achieving other advantages as can be taught or suggested herein.

DETAILED DESCRIPTION OF CERTAIN EMBODIMENTS

Figure 1:
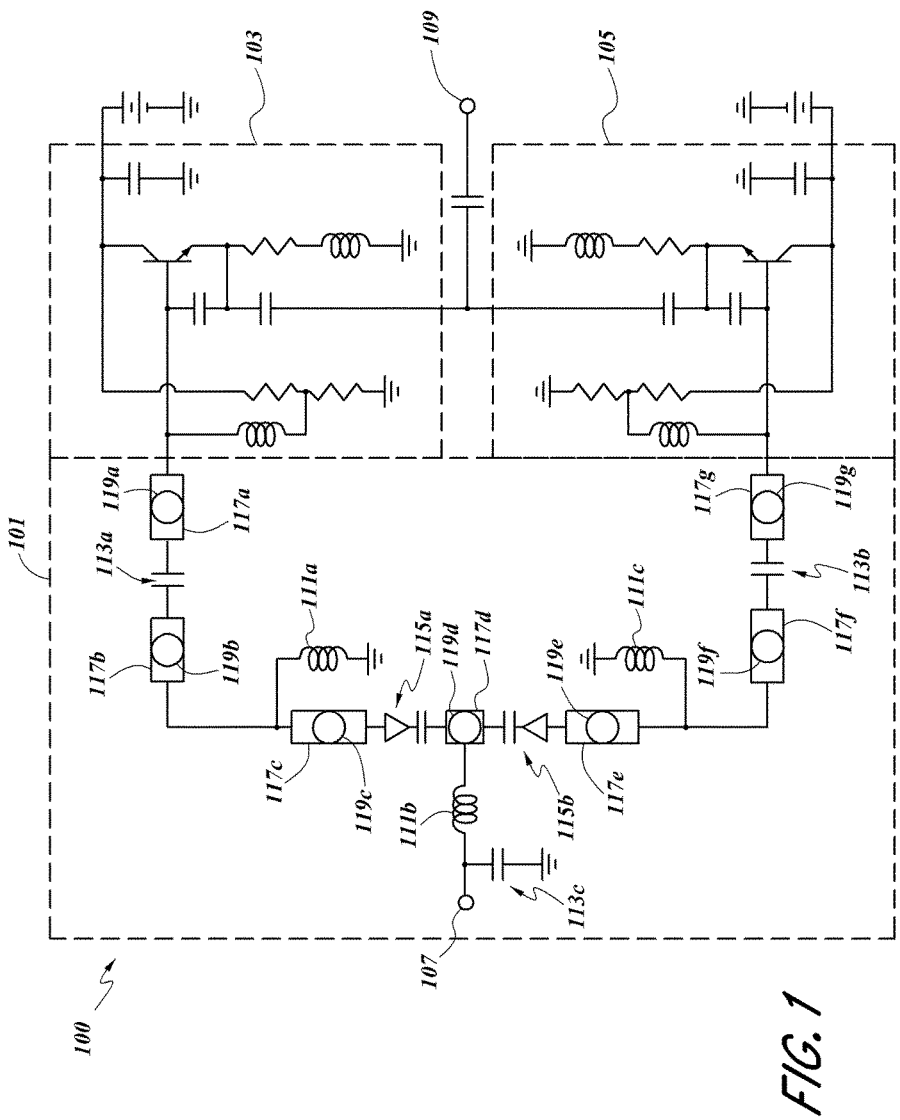
FIG. 1 is a schematic diagram of an example voltage-controlled oscillator (VCO) system on a first die according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numbers can indicate identical or functionally similar elements. It will be understood that elements illustrated in the figures are not necessarily drawn to scale. Moreover, it will be understood that certain embodiments can include more elements than illustrated in a drawings and/or a subset of the illustrated elements in a particular drawing. Further, embodiments can incorporate any suitable combination of features from two or more drawings.

As discussed above, a resonator can be characterized by a quality factor ("Q factor"). The resonator can include an inductor and a capacitive element. A capacitive element can be any component providing a capacitance, such as a varactor diode or a capacitor. The capacitive elements discussed herein are explicit capacitance elements rather than merely parasitic capacitances.

Resonators have many applications. They can be used, for example, in filters, amplifiers, tuners, mixers, and a variety of other circuits. They can also be used as parts of oscillators, including voltage-controlled oscillators (VCOs). The principles and advantages associated with the LC resonant circuits discussed herein can be implemented in connection with VCOs, fixed oscillators, filters, or any other suitable circuits with an LC resonant circuit that could benefit from lower loss.

In some applications, a relatively high Q factor can be desirable. A higher Q factor can be achieved by making resonator components less lossy. In the resonator, a capacitive element can contribute significantly to the loss of the resonator. Microstrip lines can also contribute to loss. Although increasing component size (e.g., increasing a capacitance of a capacitor) may reduce the loss, increasing the size of components is not always desirable. Larger component sizes can reduce chip yield, leave less room for other circuit components on the die, generate more heat, consume more power, result in larger packaging, etc.

To increase the Q factor, a second die can be flip chip mounted onto a first die that includes an LC resonant circuit. When certain components in different dies are coupled together, the Q factor can be increased without increasing the footprint of the resonator on the first die. With a capacitive circuit element on the second die in parallel with a capacitive element on the first die having approximately the same capacitance, the capacitance can be approximately doubled relative to just the capacitive element of the first die while simultaneously lowering loss. Doubling capacitance using the flip-chip mounted second die can approximately double the Q factor. As one example, the Q factor can be doubled from about 25 for a resonator of the first die to about 50 for a resonator that implements an embodiment. Electrically connecting a first microstrip line of a first die to a second microstrip line of a second die by way of a bump can lower the loss associated with the resonator.

FIG. 1 is a schematic diagram of an example VCO system 100 on a first die. The VCO system 100 can include a resonant circuit 101, a first active circuit 103, a second active circuit 105, an input node 107, and an output node 109. The resonant circuit 101 can include choke inductors 111a to 111c, capacitors 113a and 113b, varactor diodes 115a and 115b, microstrip lines 117a to 117g, and bump pads 119a to 119g. Each of the illustrated microstrip lines 117a to 117g can be implemented in any suitable metal layer of the first die, such as metal 0, metal 1 or metal 2. One or more of the microstrip lines 117a to 117g can be implemented in a different metal layer than one or more of the other microstrip lines 117a to 117g.

The VCO system 100 can receive an input voltage signal at input node 107 and generate an output signal at output node 109. The frequency of the output signal can be controlled by a voltage level of the input voltage signal. In the embodiment shown in FIG. 1, the VCO is a push-push type of single ended VCO including a Colpitts-type negative resistor cores as active circuits 103 and 105.

The microstrip lines of the first die electrically couple the circuit elements together. Capacitor 113a is coupled between microstrip lines 117a and 117b. Choke inductor 111a is coupled on one end to ground, and the choke inductor 111a is coupled on the other end to microstrip lines 117b and 117c. Varactor diode 115a is coupled between microstrip lines 117c and 117d. Inductor 111b is coupled on one end to input node 107 and capacitor 113c, and inductor 111b is coupled on the other end to microstrip line 117d. Capacitor 113c is coupled on one end to input node 107 and inductor 111b, and capacitor 113c is coupled on the other end to ground 121c. Varactor 115b is coupled between microstrip lines 117d and 117e. Choke inductor 111c is coupled to ground 121b on one end, and choke inductor 111c is coupled to microstrip lines 117e and 117f on the other end. While one pair of varactors is illustrated in FIG. 1, multiple varactors and/or varactor pairs can be implemented in some other embodiments. Capacitor 113b is coupled between microstrip lines 117f and 117g.

Some of the illustrated microstrip lines can be combined in certain implementations. For example, microstrip lines 117b and 117c can be implemented as a single microstrip line as different parts of a single continuous microstrip line. The same goes for microstrip lines 117e and 117f. While one resonant circuit design is shown, the principles and advantages discussed herein can be applied to any other suitable LC resonant circuit.

Bump pads 119a to 119g can be coupled to the microstrip lines 117a to 117g, respectively. On the first die, two microstrip lines on different sides of a capacitive element can have bump pads to enable the capacitive element of the first die be coupled in parallel with another capacitive element on a second die. For example, bump pads 119a and 119b on opposing sides of the capacitor 113a enable the capacitor 113a to be electrically coupled to a capacitive element on a second die that stacked on the first die by way of bumps. As another example, bump pads 119d and 119e on opposing sides of the varactor 115b enables the varactor 115b to electrically be a capacitive element on a second die that stacked on the first die by way of bumps.

Figure 2:
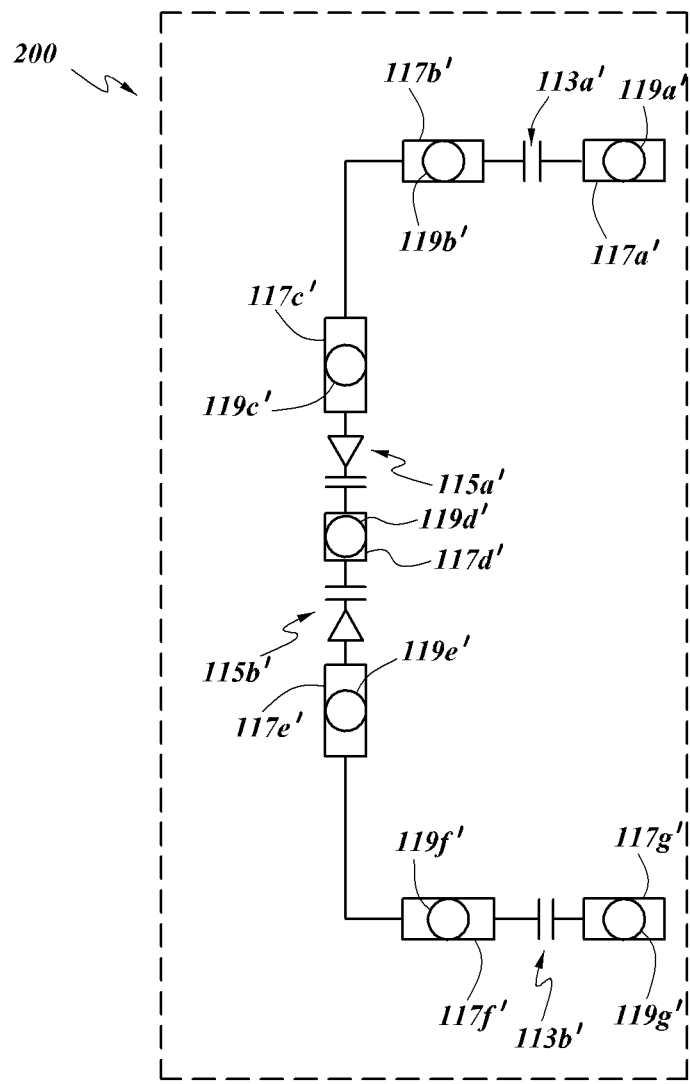
FIG. 2 is a schematic diagram of an example circuit on a second die according to an embodiment.

FIG. 2 is a schematic diagram of an example circuit 200 on a second die. The circuit 200 includes circuit elements denoted with like reference numerals and a prime symbol (') that correspond to similar parts of resonant circuit 101. As illustrated, the example circuit 200 includes microstrip lines 117a' to 117g', bump pads 119a' to 119g', capacitors 113a' and 113b', and varactors 115a' and 115b'.

The circuit 200 on the second die can be fabricated so that the circuit elements on the second die have substantially the same position, size, and layout as the corresponding parts on the first die, except that the circuit elements on the active side of the second die are flipped with respect to the active side of the first die. Accordingly, when the second die is stacked on the first die, corresponding circuit elements from the different dies can be aligned relative to each other. The second die can be flip chip mounted on top of the first die and bumps can electrically connect bump pads of the first die that are aligned with corresponding bump pads of the second die.

Flip chip mounting the second die on the first die can include electrically coupling bump pads 119a to 119g of the first die with corresponding bump pads 119a' to 119g' of the second die. This can be done using any suitable type of bumps. Bumps can be implemented by, for example, copper pillars, solder balls, solder joints, or other suitable conductive structures. Bumps can be implemented by relatively low loss metal. Using relatively low loss metal for the bumps can improve the Q factor of the resonator relative to materials with higher losses. Bumps implemented by copper pillars can provide a relatively low loss and a relatively high conductivity.

When the second die is mounted on the first die, the circuit elements of the circuit 200 of the second die can align with corresponding parts in the resonant circuit 101 of the first die. Some or all of the capacitive elements of the resonant circuit 101 of the first die can be mirrored in the circuit 200 of the second die. The bumps can electrically couple various circuit elements of the first die in parallel with corresponding circuit elements of the second die. For example, bumps can electrically connect the capacitor 113b of the first die in parallel with capacitor 113b' of the second die. As another example, bumps can electrically connect the varactor 115b of the first die in parallel with the varactor 115b' of the second die. The capacitive elements coupled in parallel with each other can have an increased effective capacitance, lower loss, and can result in an increased Q factor of the resonator. The microstrip lines on the different dies coupled in parallel with each other can be less lossy than a single microstrip on one die. The microstrip lines can also contribute to increasing the Q factor of the resonator.

As illustrated in FIG. 2, the circuit 200 of the second die does not include inductors corresponding to the inductors 111a to 111c of the first die or corresponding ground connections. Accordingly, only capacitive elements of the LC resonant circuit of the first die may be included on the second die as shown in FIG. 2. In some other embodiments, the second die can include inductors corresponding to the inductors of the resonant circuit of the first die. As illustrated in FIG. 2, the circuit 200 of the second die does not include a capacitor corresponding to the capacitor 113c of FIG. 1 in certain embodiments.

While FIG. 2 shows a plurality of capacitive elements on the second die, in some embodiments the second die can contain only a single capacitive element coupled on both ends to bump pads to reduce the loss attributed by the corresponding capacitive element on the first die. For example, in one embodiment, the second die can include capacitor 113a', microstrip lines 117a' and 117b', and bump pads 119a' and 119b'. In another embodiment, the second die can include varactor 115b', microstrip lines 117d' and 117e', and microstrip lines 117d' and 117e', and bump pads 119d' and 119e'. In some other embodiments, the second die can include all the circuit elements of a standalone resonator.

Figure 3:
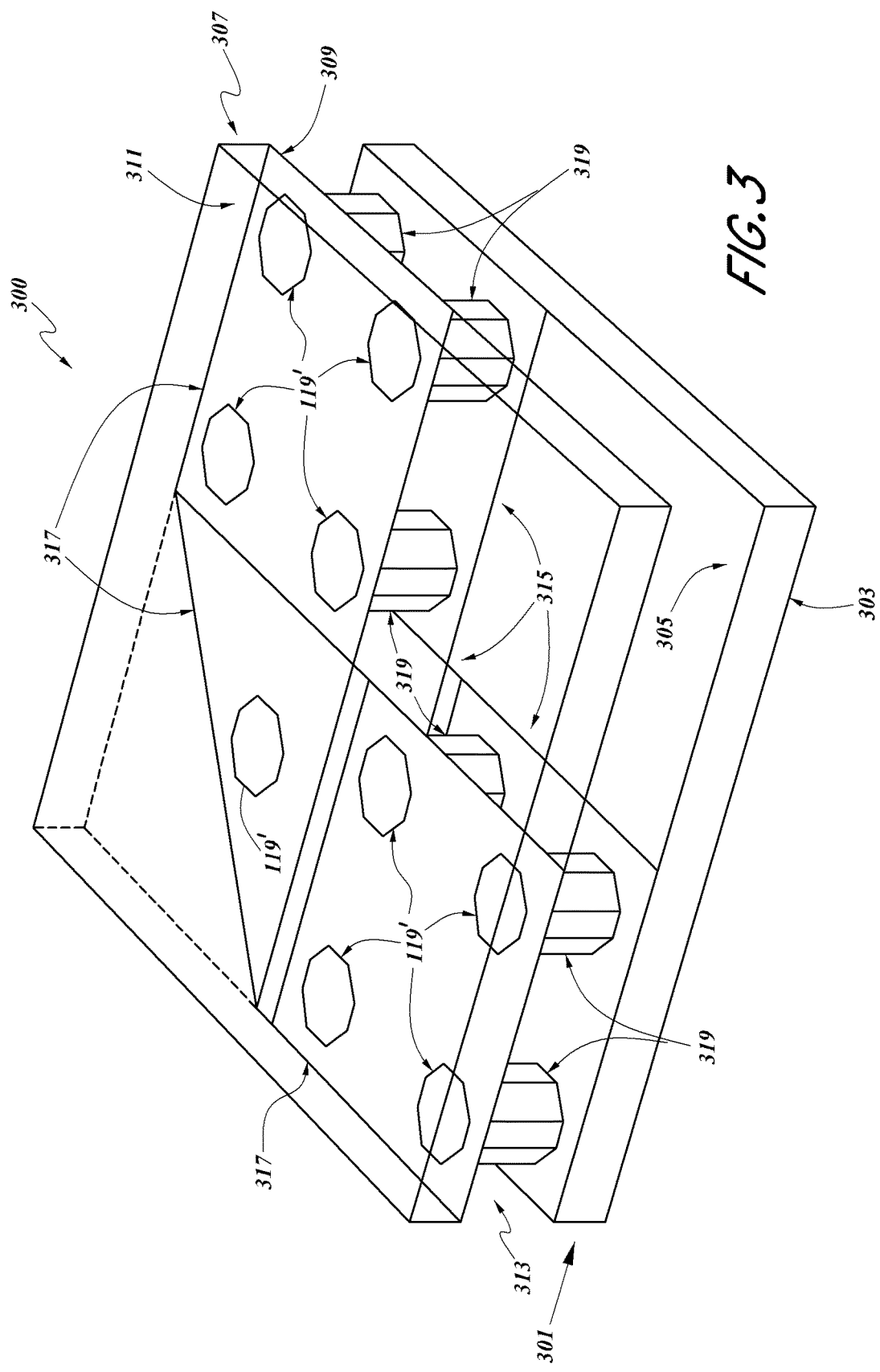
FIG. 3 is a perspective illustration of a corresponding microstrip line on a second die mirrored above a microstrip line on a first die according to an embodiment.

FIG. 3 is a perspective illustration 300 of a corresponding microstrip line 317 on a second die 307 mirrored above a microstrip line 315 on a first die 301. FIG. 3 shows microstrip lines 315 and 317, copper pillars 319, and bump pads 119'.

A first die 301 has a back side 303 and an active side 305. A microstrip line 315 can be on the active side 305 of the first die 301. The microstrip line 315 can correspond to any of the illustrated microstrips in FIG. 1, for example.

A second die 307 is positioned a space 313 above the first die 301. The second die 307 has an active side 309 and a back side 311. A corresponding microstrip line 317 can be on the active side 309 of the second die 307. The microstrip line 317 can correspond to any of the illustrated microstrips in FIG. 2, for example. Because the second die 307 has been flip chip mounted above the first die 303, the active side of the second die 307 faces down towards the first die 303. For clarity of illustration, the second die 307 is illustrated as transparent.

A bump electrically couples a bump pad 119' on the microstrip line 317 of the second die 307 to a bump pad 119 on the corresponding microstrip line 315 of the first die 301. In FIG. 3, the bump is depicted as a plurality of copper pillars 319, the bump pad of the microstrip line 317 is depicted as a plurality of bump pads 119', and the bump pads below the copper pillars 319 that couple the copper pillars 319 to the microstrip line 315 of the first die 301 are not visible from this perspective. As such, the bump pads on each opposing side of a capacitive element can each be implemented by one or more bump pads. Similarly, one or more bumps can electrically connect each end of a capacitive circuit element of the first die to a corresponding capacitive element on the second die. Having two or more bumps in parallel can reduce the resistance associated with the electrical connection between capacitive elements relative to a single bump. In various embodiments, the bumps, bump pads, and microstrip lines can each have any suitable size for a particular application. Bumps, bump pads, and/or microstrip lines can have different sizes relative to each other in certain implementations.

The microstrip line 315 can be, for example, any microstrip line 117[a-g] in the resonant circuit 101. The microstrip line 317 can be any corresponding microstrip line 117[a'-g'] in the resonant circuit 201. For example, in one embodiment, microstrip line 315 can be 117c, and microstrip line 317 can be 117c'.

The space 313 between the first die 301 and the second die 307 can be filled with any suitable nonconductive packaging material, such as plastic, an insulator, a dielectric, etc. around the copper pillars 319.

While FIG. 3 depicts only mirrored microstrip lines, it should be understood that the positioning of the second die 307 above the first die 301 and other principles described can be applied to some or all of the remainder of the resonant circuit 100 of the first die and corresponding circuit elements of the second die.

Figure 4:
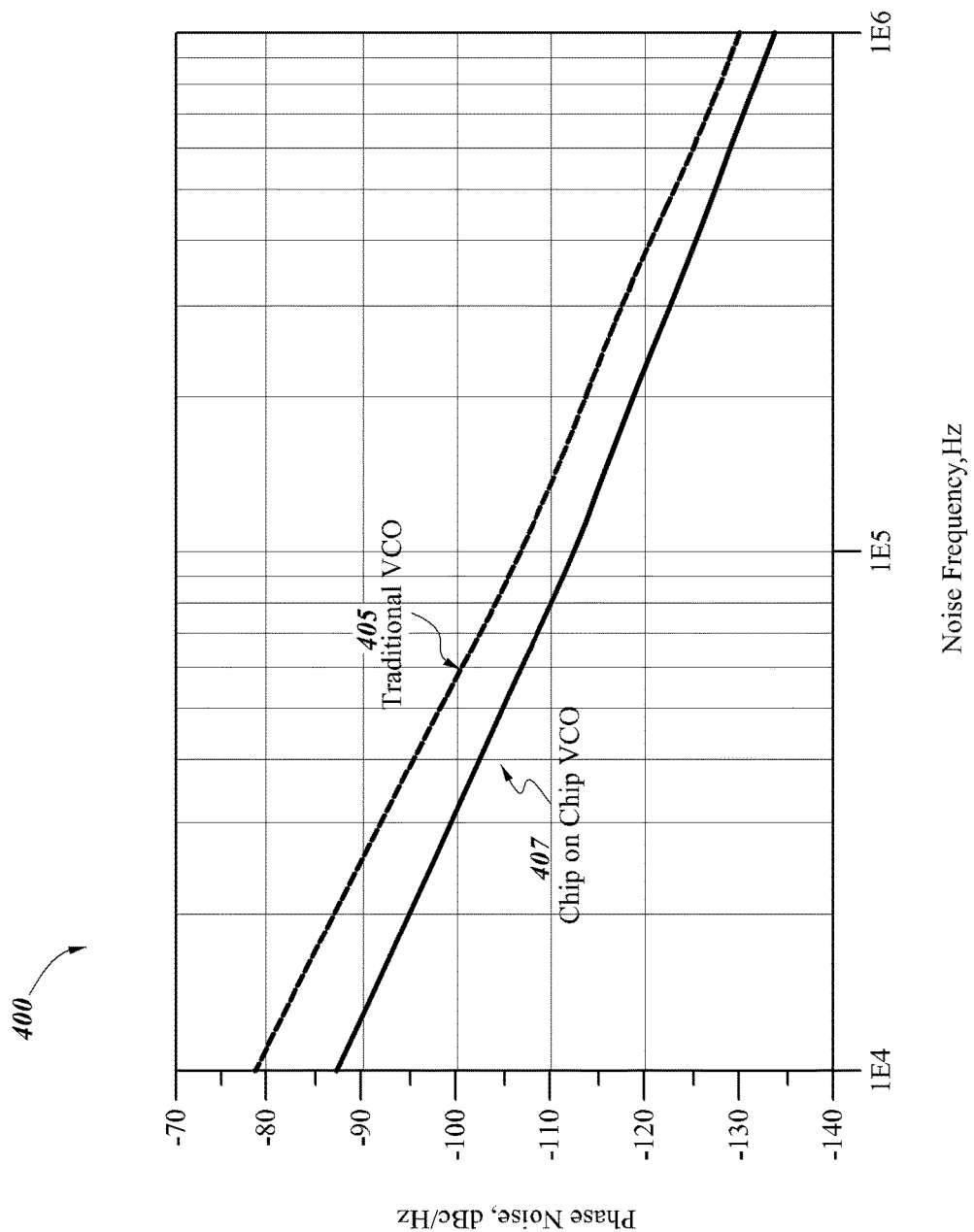
FIG. 4 is a graph comparing, at various noise frequencies, phase noise of one embodiment to phase noise of a traditional VCO.

FIG. 4 is a graph 400 that illustrates a relationship of phase noise over noise frequency of a traditional VCO compared to a VCO according to an embodiment. An x-axis represents the noise frequency of a VCO on a log scale ranging from 1,000 Hertz to 1,000,000. A y-axis represents the phase noise generated by the VCO from −140 dBc/Hz to −70 dBc/Hz.

A curve 405 represents the phase noise generated across the range of noise frequencies of a traditional VCO. A second curve 407 represents the phase noise generated across the range of noise frequencies for one embodiment of a VCO system that includes a first die with a resonant circuit and a second die that is flip chip mounted on a first die.

Notably, the flip-chip VCO embodiment generates less phase noise across the depicted range of frequencies compared to a traditional VCO. For instance, there is an approximately 10 dBc/Hz improvement at 10 KHz for the VCO system that include the second die that is flip chip mounted on the first die relative to the traditional VCO.

Figure 5:
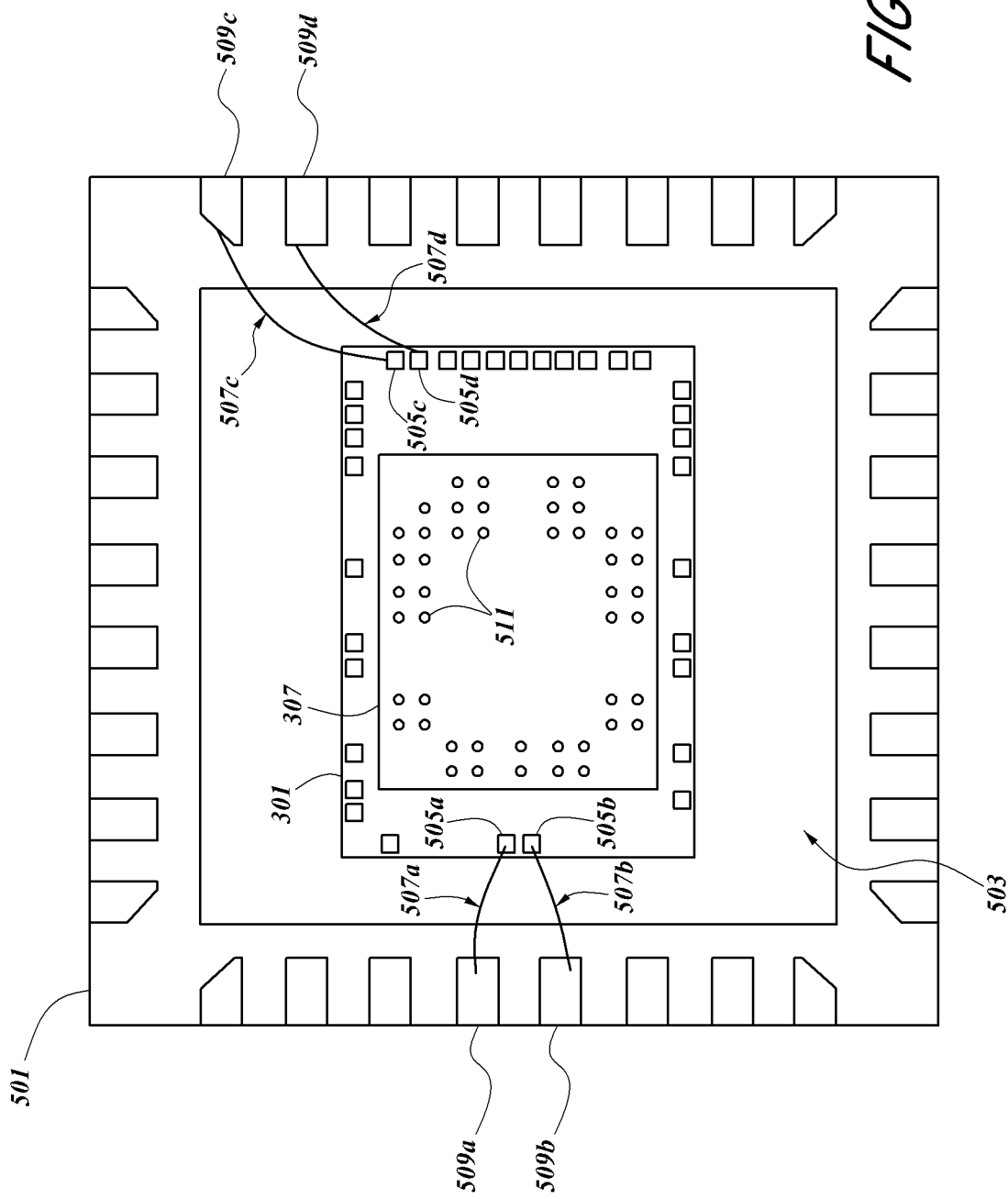
FIG. 5 is a schematic of a package for two dies according to an embodiment.

FIG. 5 is a schematic of a package 501 for two dies 301 and 307. The schematic includes a quad flat no-leads (QFN) package 501 including a die paddle 503, a first die 301, a second die 307 flip chip mounted onto the first die 301, a plurality of wire bond pads 505a to 505d coupled by bond wires 507a to 507d to various I/O package contacts 509a to 509d. While four bond wires 507a to 507d are illustrated, it will be understood that a bond wire can electrically connect each of the 32 I/O package contacts or any suitable subset thereof. Some embodiments can include dies with complicated circuitry and a relatively large number of I/O pads on the die that are coupled to I/O package contacts in order to transmit or receive electric signals for a variety of different purposes. In certain implementations, the package can be 5 mm by 5 mm. In some of these implementations, centers of adjacent I/O package contacts can be spaced apart by about 0.5 mm.

A plurality of bumps and bump pads (collectively labeled 511) couple circuit elements on the first die 301 to corresponding circuit elements on the second die 307. While bumps and bump pads 511 are illustrated in FIG. 5, it will be understood that they are underneath the opaque second die 307 and might not be visible from the illustrated perspective view.

In some embodiments, the first die 301 comprises resonant circuit 101 as part of a VCO system 100 from FIG. 1. Input node 107 of FIG. 1 can be coupled to wire bond pad 505a, which can be electrically connected by way of a bond wire 507a to package I/O contact 509a. The VCO system 100 output node 109 of FIG. 1 can be coupled to wire bond pad 505c, which can be electrically connected by way of a bond wire 507c to package I/O contact 509c.

In some embodiments, the first die 301 comprises a resonant circuit. Package I/O contact 509a can be electrically connected by way of a bond wire 507a to wire bond pad 505a, which can be coupled to an input of the resonant circuit. An output node of the resonant circuit can be coupled to wire bond pad 505c, which can be electrically connected by way of a bond wire 507c to package I/O contact 509c.

In some embodiments, the first die 301 comprises a filter that contains a resonant circuit. Package I/O contact 509a can be wire bonded 507a to wire bond pad 505a, which can be coupled to an input of the filter for receiving an input signal. An output node of the filter can be coupled to wire bond pad 505c, which can be wire bonded 507c to package I/O contact 509c in order to output a filtered signal.

Figure 6:
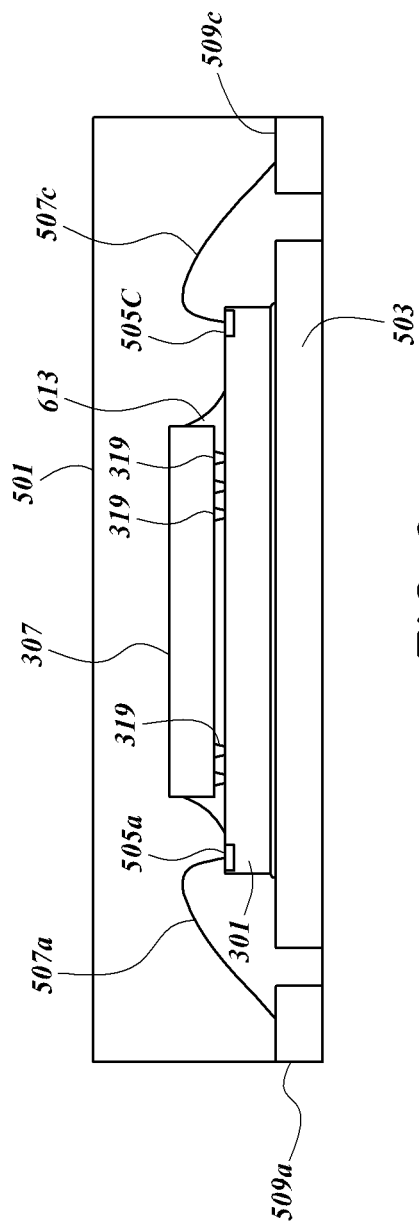
FIG. 6 is a schematic cross sectional side view of two stacked dies inside of a package according to an embodiment.

In some embodiments, package I/O contact 509b can be electrically connected by way of a bond wire 507b to wire bond pad 505b, which can be coupled to a power input node on the first die 301. A grounding node can be coupled to wire bond pad 505d, which can be electrically connected by way of a bond wire 507d to package I/O contact 509d. In some embodiments, the wire bond pad 505d can be coupled to a ground plane FIG. 6 is a schematic cross sectional side view of two stacked dies 301, 307 inside of a package 501. The cross sectional side view of FIG. 6 can correspond to the package of FIG. 5. The package 501 comprises I/O pins 509a and 509c, bond wires 507a and 507c, wire bond pads 505a and 505c, die paddle 503, copper pillars 319, and a filler material 613.

The second die 307 is flip chip mounted on a first die 301. Capacitive elements of the first die 301 are coupled in parallel with capacitive elements of the second die 307 through the copper pillars 319.

A filler material 613 fills a space between the first die 301 and the second die 307. The filler material can be, for example, a plastic, a dielectric, an insulator, or any other suitable filler material. In some embodiments, the filler material can be air. In some other embodiments, the filler material 613 can serve to prevent air or moisture from getting between the first die 301 and the second die 307. In some embodiments, the filler material provides structural support for the second die 307 to rest on top of the first die 301 in addition to the structural support provided by the copper pillars 319.

The package 501 can be a QFN or any other suitable type of IC package. The package 501 can be made of plastic, an electrical insulator, a thermal conductor, or any other suitable type of encapsulation material. The package 501 has a package I/O contact 509a, which can be an I/O pin as illustrated. A bond wire 507a can electrically connect the package I/O contact to a wire bond pad 505a on the first die 301. The first die 301 also has a wire bond pad 605b that is electrically coupled by way of wire bond 507c to package I/O contact 509c. The wire bond pads 505a and 505c on the first die 301 can provide electrical connections to a circuit on the first die 301.

In some embodiments, the first die 301 can include a VCO system 100, and the VCO system 100 is configured to receive a signal having an input voltage. The input signal can be transmitted through package I/O contact 509a, bond wire 507a, and bond wire pad 505a to input node 107 of the VCO. An output signal having an oscillation frequency controlled by the voltage of the input signal can be transmitted through output node 109 of the VCO, the bond pad 505c, bond wire 507c, and through package I/O contact 509c.

In some embodiments, the I/O contacts (e.g., I/O pins) can be used for different purposes or connect to different parts of the same or different circuits. For example, they can connect to parts of a resonator, an oscillator, a filter, etc. The second die 307 can include capacitive circuit elements of a resonator in a variety of applications previously discussed, and additional circuitry can use a resonator in different ways. The resonator can generate an output signal that is used internally within the die, and the die can have a different output signal transmitted through the package I/O contact 509c.

Figure 7:
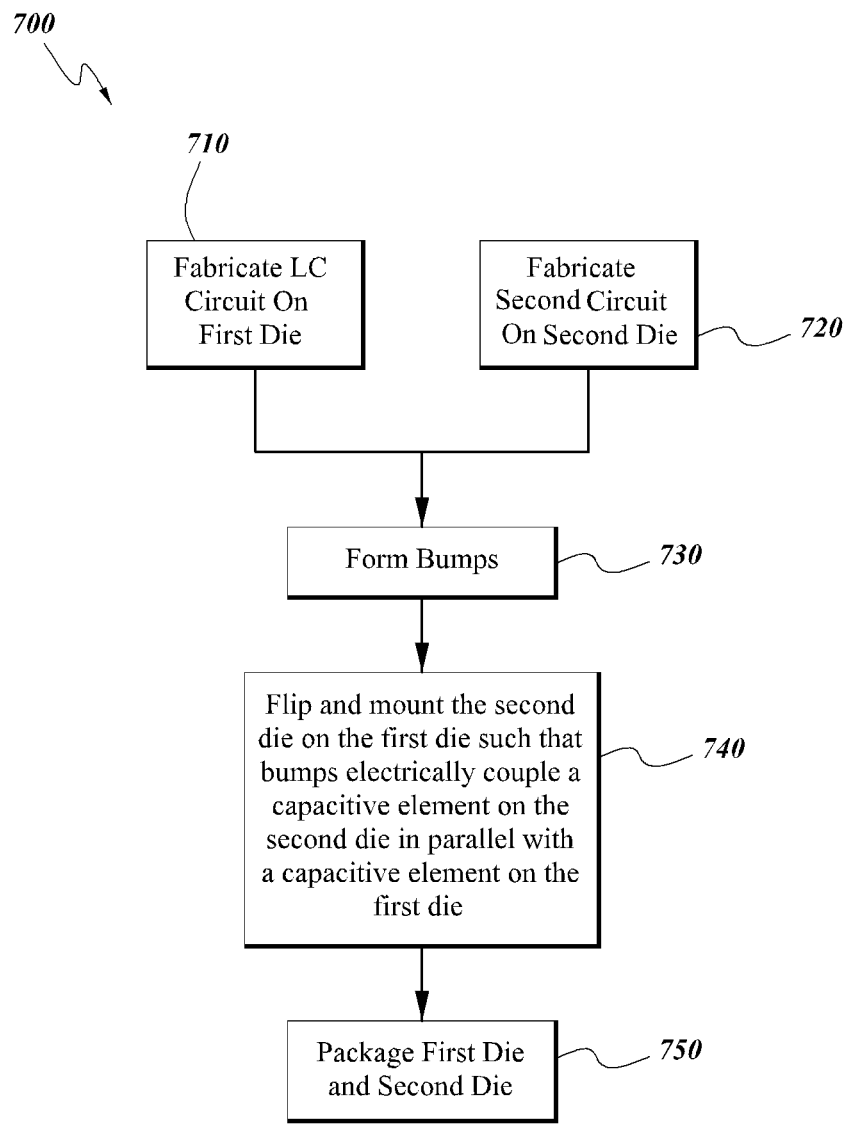
FIG. 7 is a flowchart of a method for manufacturing an electronic device according to an embodiment.

FIG. 7 is a flowchart of an illustrative method 700 of manufacturing an electronic device. At block 710, a first LC circuit is fabricated on a first die, such as the first die 301. After fabrication, the first die can be diced. The first die can include any combination of features of the first die discussed herein. The first die includes an LC resonant circuit, which includes a capacitive circuit element. At block 720, a second circuit is fabricated on a second die, such as the second die 307. The second die can include any combination of features of the second dies discussed herein. The second die includes at least a capacitive circuit element. The second circuit can mirror and/or align with parts of the first circuit after the second circuit is mounted on the first die. The second circuit can be a flipped version of the first circuit.

At block 730, bumps can be formed. In some embodiments, the bumps can be formed on the second die. In some other embodiments, the bumps can be formed on the first die. The bumps can be formed on bump pads.

In some embodiments, the second die can be diced after fabricating the second circuit on the second die and before the second die is diced. In some other embodiments, the second die can be diced after forming bumps on the second die.

At block 740, the second die is flipped and mounted on the first die. In this method, the second die is flipped such that the active side of the second die is facing the active side of the first die. When the second die is stacked on the first die, corresponding circuit elements from the dies can be aligned. Accordingly, the flipping and mounting at block 740 can cause the bumps to electrically couple a capacitive element on the second die in parallel with a capacitive element on the first die.

In some embodiments, the first die can be epoxied or otherwise fastened onto a die paddle prior to the flipping and mounting of the second die on the first die. The bumps can be reflowed after the second die is flipped and mounted onto the first die.

The first die can comprise an LC resonant circuit. The LC resonant circuit can comprise a capacitive element, such as a capacitor or varactor, an inductive element such as an inductor; and an output node. The LC resonant circuit can comprise microstrip lines and a plurality of capacitive elements. An output signal that resonates at a resonant frequency can be output at the output node. The bumps can comprise copper pillars, solder balls, solder joints, other solder forms, or other metal or electrically conductive bumps of various shapes. In some embodiments, the first die comprises an LC resonant circuit as part of a VCO. The VCO can generate, at an output node, an output signal that oscillates at an output frequency controlled by a voltage of an input signal received at an input node.

The second die can comprise a portion of an LC resonant circuit such as a capacitive element. In some embodiments, the circuit on the second die can be a standalone LC resonant circuit. The circuit on the second die can comprise a plurality of capacitive elements and a plurality of microstrip lines.

At block 750, the first die and the second die can be packaged together. A space between the first die and the second die can be filled with an insulating material. Pins of a package can be electrically connected to the first die, for example, by wire bonding. The first die and the second die can be encased in a packaging material. In one embodiment, an output node in the first die is coupled, such as by wire bonding, to a package output pin, and an input node in the first die is coupled, such as by wire bonding, to a package input pin. An overmold can be applied over the first and second die.

In one embodiment, an output of an active circuit on the first die is coupled, such as by wire bonding, to a package output pin. The active circuit can be a circuit different from the LC resonant circuit and different from the VCO. The active circuit can receive, as an input, an output signal from the LC resonant circuit or VCO.

The acts of the methods discussed herein can be performed in any order as appropriate. Moreover, the acts of the methods discussed herein can be performed serially or in parallel, as appropriate.

Various embodiments can apply different techniques for fabricating different types of electronic devices. One embodiment applies to the fabrication of monolithic microwave integrated circuits (MMIC).

In the embodiments described above, apparatus, systems, and methods for a resonant circuit that is implemented on a first die and a second die that is flip chip mounted on the first die are described in connection with particular embodiments. It will be understood, however, that the principles and advantages of the embodiments can be used for any other systems, apparatus, or methods with a need for resonator. Although certain embodiments are described with reference to an example LC resonator circuit, it will be understood that the principles and advantages described herein can be applied to signals generated by other resonators and used in a variety of applications. While some of the disclosed embodiments may be described with reference to a push-push type of single ended VCO featuring a Colpitts type of negative resistor core as active circuits, the principles and advantages discussed herein can be applied to other types of VCO's and active circuits, fixed oscillators, filters, or other suitable circuits that include an LC resonant circuit. While the disclosed embodiments may be described with reference to certain pin and/or package layouts, the principles and advantages discussed herein can be applied to other types of pin and package layouts. Moreover, while some circuits schematics are provided for illustrative purposes, other equivalent circuits can alternatively be implemented to achieve the functionality described herein.

In the embodiments described above, a second die is flip chip mounted on a first die. The principles and advantages discussed herein can be applied to three or more dies in a vertical stack. With three or more dies in a vertical stack, vias through one or more intermediate dies or other techniques for electrically coupling the circuits on each die to each other in parallel can be implemented. For instance, a vie extending through a die can electrically connect bump pads on opposing sides of the die and these bump pads can be electrically connected to other dies in the stack by way of bumps. Alternatively or additionally, the principles and advantages discussed herein can be applied to a first die having two or more different dies flip chip mounted thereon, in which the two or more different dies are not stacked over one another.

The term microstrip line, as used in the application, need not necessarily be microscale, a strip shape, or line shaped. For example, FIG. 3 depicts part of a microstrip line that changes direction. Microstrip lines do not include the parts of bonding wires external to a die. The term mirroring, as used in the application, need not refer to a perfect actual reflection, as fabrication tolerances are imperfect and circuit elements can be adjusted for routing or fabrication rules. Furthermore, it should be noted that some symmetrical circuits can be considered flipped. The term bump pads, as used through this application, need not necessarily be a physical bump or shaped like a pad. For example, sometime bump pads refer to exposed openings at the surface of a die. The term pin, as used in the application, need not necessarily have a pointy end.

The principles and advantages described herein can be implemented in various apparatuses. Examples of such apparatuses can include, but are not limited to, consumer electronic products, parts of the consumer electronic products, electronic test equipment, etc. Examples of parts of consumer electronic products can include clocking circuits, analog-to-digital converts, amplifiers, rectifiers, programmable filters, attenuators, variable frequency circuits, etc. Examples of the electronic devices can also include memory chips, memory modules, circuits of optical networks or other communication networks, cellular communications infrastructure such as base stations, and disk driver circuits. Consumer electronic products can include, but are not limited to, wireless devices, a mobile phone (for example, a smart phone), healthcare monitoring devices, vehicular electronics systems such as automotive electronics systems, a telephone, a television, a computer monitor, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that can be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number can also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein can be embodied in a variety of other forms. Furthermore, various omissions, substitutions and changes in the form of the methods and systems described herein can be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A system comprising:
   a first die comprising:
      an LC resonant circuit comprising a first capacitive element and an inductive element, the first capacitive element having a first end and a second end, wherein the inductive element is coupled to the first capacitive element by way of a first micro strip line of the first die;
   a second die stacked on the first die, the second die comprising a second microstrip line and a second capacitive element having a first end and a second end;
   a first bump electrically coupling the first end of the first capacitive element to the first end of the second capacitive element, wherein the second microstrip line is coupled in parallel to the first microstrip line by way of the first bump so as to lower a loss associated with a resonator that includes the LC resonant circuit; and
   a second bump electrically coupling the second end of the first capacitive element to the second end of the second capacitive element, such that the first bump and the second bump electrically connect the first capacitive element in parallel with the second capacitive element, wherein the first capacitive element being in parallel with the second capacitive element causes a quality factor of the resonator to be increased.

2. The system of claim 1, wherein the first capacitive element comprises at least one of a first varactor diode or a first capacitor.

3. The system of claim 1, wherein the first bump comprises at least one of a copper pillar, a solder ball, or a solder joint.

4. The system of claim 1, wherein a second circuit on the second die is a flipped, mirror image of a first circuit on the first die, and wherein the first circuit comprises the first capacitive element.

5. The system of claim 1, wherein the first die comprises at least one capacitor and at least one varactor.

6. The system of claim 1, further comprising:
   a package encapsulating the first die and the second die;
   an insulator disposed between the first die and the second die; and
   a wire bond coupling the first die to a pin of the package.

7. The system of claim 1, wherein the first die comprises a voltage controlled oscillator (VCO), the VCO comprising the LC resonant circuit, wherein the VCO has a resonant frequency that is based on a tuning voltage received by the VCO.

8. The system of claim 7, further comprising a plurality of active circuits on the first die.

9. A die comprising:
   an LC resonant circuit configured to generate a signal at an output node, the signal oscillating at a resonant frequency, the LC resonant circuit comprising:
      a capacitive element having a first end and a second end;
      an inductive element electrically coupled to the capacitive element by way of a first microstrip line of the die; and
      a circuit element electrically coupled in series between the capacitive element and the output node, the circuit element effecting the resonant frequency of the signal;
   a first bump pad electrically coupled to the first end of the capacitive element, wherein the first bump pad is positioned on the first microstrip line such that the first microstrip line is configured to couple to a second microstrip line of another die so as to lower a loss associated with the LC resonant circuit; and
   a second bump pad electrically coupled to the second end of the capacitive element.

10. The die of claim 9, wherein the capacitive element comprises at least one of a varactor diode or a capacitor.

11. The die of claim 9, wherein the inductive element is configured as a choke inductor, and wherein the choke inductor is coupled to the capacitive element by way of the first microstrip line.

12. The die of claim 9, wherein the LC resonant circuit comprises a second capacitive element, and wherein the die comprises a third bump pad connected to the second capacitive element.

13. The die of claim 9, wherein the die comprises a voltage controlled oscillator, wherein the voltage controlled oscillator comprises the LC resonant circuit.

14. The die of claim 9, wherein the first bump pad is disposed on the first microstrip line and the second bump pad is disposed on a third microstrip line.

15. A method of manufacturing a monolithic microwave integrated circuit, the method comprising:
electrically coupling a first bump from a first end of a first capacitive element on a first integrated circuit die to a first end of a second capacitive element on a second integrated circuit die, wherein the first capacitive element is included in an LC resonant circuit of the first integrated circuit die, and wherein the first capacitive element is coupled to a first micro strip line of the first integrated circuit die; and
electrically coupling a second bump from a second end of the first capacitive element on the first integrated circuit die to a second end of the second capacitive element on the second integrated circuit die such that the second capacitive element is electrically connected in parallel with the first capacitive element, wherein a second microstrip line of the second integrated circuit die is coupled to the first microstrip line by way of the second bump so as to lower a loss associated with the LC resonant circuit.

16. The method of claim 15, wherein the first bump comprises at least one of a copper pillar, a solder ball, or a solder joint.

17. The method of claim 15, further comprising mounting the second integrated circuit die on the first integrated circuit die such that bump pads of the first integrated circuit die are aligned with corresponding bump pads of the second integrated circuit die.

18. The method of claim 15, further comprising
filling a space between the first integrated circuit die and the second integrated circuit die with an insulating material; and
encasing the first integrated circuit die and the second integrated circuit die in a packaging material.

19. The system of claim 1, wherein at least a part of the second capacitive element is vertically positioned above the first capacitive element, and wherein a footprint of the second die is within a footprint of the first die.

20. The system of claim 1, wherein the LC resonant circuit is on an active side of the first die, the second capacitive element is on an active side of the second die, and the active side of the first die is facing the active side of the second die.

21. The method of claim 15, further comprising positioning an active side of the first integrated circuit die to face an active side of the second integrated circuit die, wherein the electrically coupling the first bump is performed while the active side of the first integrated circuit die is facing the active side of the second integrated circuit die.

* * * * *

UNITED STATES PATENT AND TRADEMARK OFFICE
CERTIFICATE OF CORRECTION

PATENT NO. : 9,929,123 B2
APPLICATION NO. : 14/733175
DATED : March 27, 2018
INVENTOR(S) : Cemin Zhang et al.

Page 1 of 1

It is certified that error appears in the above-identified patent and that said Letters Patent is hereby corrected as shown below:

In the Specification

In Column 4 at Line 41, Change "117f" to --117f.--.

In the Claims

In Column 11 at Line 63, In Claim 1, change "micro strip" to --microstrip--.

In Column 13 at Line 19, In Claim 15, change "micro strip" to --microstrip--.

Signed and Sealed this
Twenty-sixth Day of June, 2018

Andrei Iancu
*Director of the United States Patent and Trademark Office*